United States Patent
Tamura et al.

(10) Patent No.: US 8,878,067 B2
(45) Date of Patent: Nov. 4, 2014

(54) ELECTRONIC-COMPONENT LEAD TERMINAL AND METHOD OF FABRICATING THE SAME

(75) Inventors: Hiroaki Tamura, Kawasaki (JP); Fumihiko Tokura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 251 days.

(21) Appl. No.: 13/349,180

(22) Filed: Jan. 12, 2012

(65) Prior Publication Data
US 2012/0234595 A1   Sep. 20, 2012

(30) Foreign Application Priority Data

Mar. 19, 2011  (JP) .................................. 2011-061819

(51) Int. Cl.
| H01B 5/00 | (2006.01) |
| B23K 26/06 | (2014.01) |
| B23K 26/40 | (2014.01) |
| B23K 26/36 | (2014.01) |
| H05K 3/34 | (2006.01) |

(52) U.S. Cl.
CPC ............ B23K 26/367 (2013.01); B23K 26/063 (2013.01); *B23K 2201/42* (2013.01); B23K 26/409 (2013.01); *B23K 2201/34* (2013.01); H05K 3/3426 (2013.01); B23K 26/0621 (2013.01); *B23K 2203/18* (2013.01); *H05K 2203/046* (2013.01)
USPC ....... 174/126.2; 174/70 R; 174/260; 174/261; 257/666

(58) Field of Classification Search
USPC .......... 439/83, 874, 876, 884, 886; 174/94 R, 174/70 R, 84 R, 126.2, 263, 260, 261; 361/772, 773, 774, 743, 813; 257/690, 257/692, 734, 678, 666, 676, 669
See application file for complete search history.

(56) References Cited

U.S. PATENT DOCUMENTS

| 5,367,124 | A | * | 11/1994 | Hoffman et al. ............... 174/552 |
| 5,934,951 | A | * | 8/1999 | Lai et al. ........................ 439/876 |
| 6,712,625 | B2 | * | 3/2004 | Saito et al. ...................... 439/83 |
| 7,080,451 | B2 | * | 7/2006 | Saito et al. ...................... 29/874 |
| 7,601,012 | B2 | * | 10/2009 | Ju ................................... 439/83 |
| 8,235,733 | B2 | * | 8/2012 | Yamashiro et al. ............. 439/83 |
| 8,454,397 | B2 | * | 6/2013 | Nishi et al. .................... 439/876 |
| 2009/0149088 | A1 | | 6/2009 | Moriuchi et al. |

FOREIGN PATENT DOCUMENTS

| JP | 04-199551 A | 7/1992 |
| JP | 2004-152750 A | 5/2004 |
| JP | 2007-173224 A | 7/2007 |
| JP | 2007-179922 A | 7/2007 |
| WO | 2007/024005 A1 | 3/2007 |

* cited by examiner

*Primary Examiner* — Angel R Estrada
*Assistant Examiner* — Dimary Lopez Cruz
(74) *Attorney, Agent, or Firm* — Westerman, Hattori, Daniels & Adrian, LLP

(57) ABSTRACT

An electronic-component lead terminal includes a lead terminal one end of which is connectable to an electronic component and the other end of which is connectable to an electrode, and a solder-wicking prevention area formed on a surface of the lead terminal so as to intersect a solder-wicking direction oriented from the other end toward the one end, the solder-wicking prevention area including a plurality of portions projecting to a downstream side in the solder-wicking direction.

12 Claims, 13 Drawing Sheets

FIG. 9

| MACHINED SHAPE | SCHEMATIC VIEW | LOAD METER OUTPUT (mV) | MACHINING AREA OF LEAD PER 1 mm IN WIDTH DIRECTION (mm²) |
|---|---|---|---|
| 60-μm-WIDE STRAIGHT LINE (COMPARATIVE EXAMPLE) | 10-2, 11a-2, 60 μm | 16 | 0.06 |
| SINE-WAVE SHAPE (EMBODIMENT) | 10-1, 11a-1, SIN WAVE WIDTH 20 μm AMPLITUDE 50 μm WAVELENGTH 200 μm | 22 | 0.031 |

ELECTRONIC-COMPONENT LEAD TERMINAL AND METHOD OF FABRICATING THE SAME

CROSS-REFERENCE TO RELATED APPLICATION

This application is based upon and claims the benefit of priority of the prior Japanese Patent Application No. 2011-061819, filed on Mar. 19, 2011, the entire contents of which are incorporated herein by reference.

FIELD

The embodiments discussed herein are related to an electronic-component lead terminal and a method of fabricating the same.

BACKGROUND

As electronic components have become smaller, it has become more important to securely bond electronic components and printed boards. Electronic components and printed boards are bonded to each other by connecting lead terminals of the electronic components and electrode pads on the printed boards with solder, which serves as a base material. Hereinbelow, the electrode pads may be referred to as "electrodes".

For example, in a reflow process in a surface mount technology (SMT), as illustrated in FIG. 18, bonding portions are formed by melting solder 403 provided on electrode pads 402, allowing the solder 403 to flow toward lead terminals 401 and to harden.

The molten solder 403 wicks up the lead terminals 401 by surface tension. At this time, a large amount of solder 403 flows toward the electronic component (the lead terminals 401).

As a result, the amount of solder 403 between the lead terminals 401 and the electrode pads 402 becomes insufficient, producing gaps G, as illustrated in FIG. 19A, which leads to poor bonding.

Furthermore, as illustrated in FIG. 19B, the solder 403 forms a solder deposit at the bases, on the electronic component side, of the lead terminals 401. This solder deposit and the solder 403 on the adjacent lead terminal 401 may cause a short-circuiting (a short-circuited portion S).

Therefore, a surface having low solder wettability (a wicking prevention area) is provided on the lead terminals to suppress wicking. The solder-wicking prevention area is provided by a forming nickel (Ni) surface, which has low solder wettability, on a predetermined part of a gold (Au) surface, which has high solder wettability.

The solder-wicking prevention area having a linear shape extending perpendicular to the direction in which solder wicks is formed by, for example, removing Au plating by laser beam machining or etching to expose Ni plating on the base material, i.e., copper (Cu).

As illustrated in FIGS. 20A and 20B, if a solder-wicking prevention area 401a of the lead terminal 401 has a width of, for example, 0.02 mm, solder (403-1 to 403-3) flows over the solder-wicking prevention area 401a in a solder-wicking direction D.

In contrast, as illustrated in FIGS. 21A, 21B, and 22, if a solder-wicking prevention area 401b of the lead terminal 401 has a width of, for example, 0.2 mm, solder (403-11 to 403-13) does not flow over the solder-wicking prevention area 401b.

As has been described, a wider solder-wicking prevention area has a better solder-wicking preventing performance. However, forming a wider solder-wicking prevention area may use higher laser output or longer laser irradiation time. If higher laser output is to be obtained, a laser device having a higher output has to be used, and if longer laser irradiation time is to be obtained, longer machining time (cycle time) has to be taken. In either case, a great deal of electric power is consumed. Related art includes Japanese Laid-open Patent Publication Nos. 4-199551, 2004-152750, 2007-173224, and 2007-179922, and International Application Publication No. WO2007/24005.

SUMMARY

According to an aspect of the invention, an apparatus includes an electronic-component lead terminal includes a lead terminal one end of which is connected to an electronic component and the other end of which is connectable to an electrode, and a solder-wicking prevention area formed on a surface of the lead terminal so as to intersect a solder-wicking direction oriented from the other end toward the one end, the solder-wicking prevention area including a plurality of portions projecting to a downstream side in the solder-wicking direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is a graph of solder-wicking preventing performance evaluation results.

DESCRIPTION OF EMBODIMENTS

Figure 1:
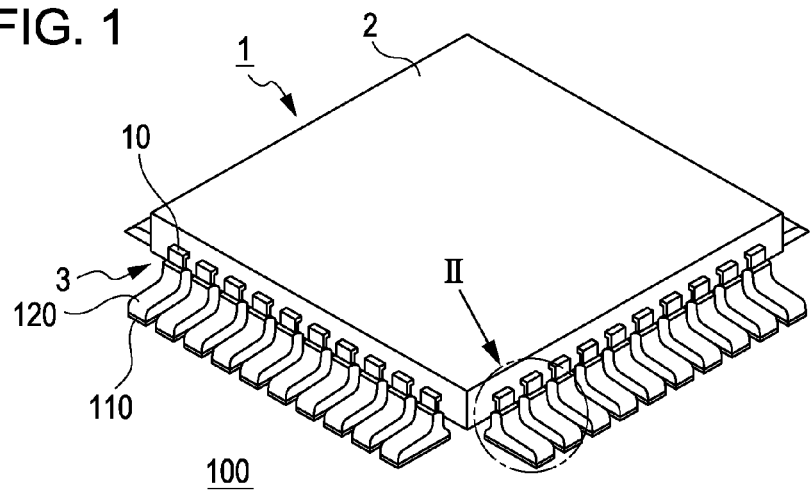
FIG. 1 is a perspective view of an electronic component.
Figure 2:
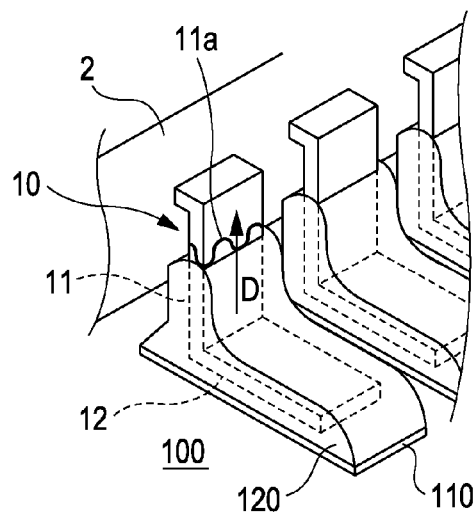
FIG. 2 is an enlarged view of a part II in FIG. 1.
Figure 3:
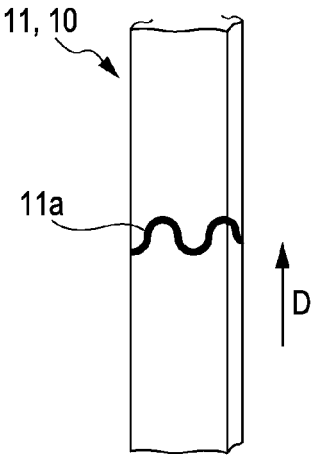
FIG. 3 is a perspective view of a vertical portion of an electronic-component lead terminal.

FIG. 1 is a perspective view of an electronic component 1.
FIG. 2 is an enlarged view of a part II in FIG. 1.
FIG. 3 is a perspective view of a vertical portion 11 of an electronic-component lead terminal 10.

The electronic component 1 is of, for example, a quad flat package (QFP) type and includes an electronic component body 2 and a lead frame 3 having a plurality of electronic-component lead terminals 10 connected to the electronic component body 2. The other end is connectable to an electrode pad of a printed board.

The lead frame 3 is disposed such that the electronic-component lead terminals 10 extend from four side surfaces of the electronic component body 2, for example.

As illustrated in FIG. 2, the body of each electronic-component lead terminal 10 is, for example, gull-wing-shaped, whose one end is connected to the electronic component body 2 and the other end is connected to an electrode pad 110 of a printed board 100. The body of the electronic-component lead terminal 10 is projected in a direction parallel to the printed board 100, is bent perpendicularly toward the printed board 100 (this part constitutes the vertical portion 11), and is bent in the direction parallel to the printed board 100, i.e., the direction in which it was first projected, from the tip (lower end) of the vertical portion 11 (this part constitutes a parallel portion 12).

The electronic-component lead terminals 10 are electrically connected to the electrode pads 110 by melting solder 120 provided on the electrode pads 110 on the printed board 100 by, for example, hot-air reflow, infrared reflow, or vapor phase reflow.

As illustrated in FIGS. 2 and 3, a solder-wicking prevention area 11a is formed on the surface of the vertical portion 11, which is the portion between one end and the other end of the body of the electronic-component lead terminal 10, so as to intersect a solder-wicking direction (arrow D) from the other end toward one end and so as to include a plurality of peak portions (11a) projecting to the downstream side in the solder-wicking direction (arrow D). The solder-wicking prevention area 11a is formed over the entire circumference of the vertical portion 11 (the electronic-component lead terminal 10).

The solder-wicking prevention area 11a is formed in a wave-shaped (sine-wave-shaped) line or band projecting both to the upstream side and the downstream side in the solder-wicking direction (arrow D).

Although the QFP-type electronic component 1 and its electronic-component lead terminals 10 are illustrated in FIG. 1, the electronic component may be of any type as long as the electronic component has lead terminals. Furthermore, the lead terminals may also be of any type as long as the lead terminals are disposed on the electronic component.

Furthermore, the solder-wicking prevention area 11a may be formed on a portion of the circumference, for example, only on the front and rear surfaces, not on the entire circumference of the vertical portion 11 (electronic-component lead terminal 10).

Furthermore, although it is desirable that the solder-wicking prevention area 11a that is continuous in the circumferential direction of the vertical portion 11 (electronic-component lead terminal 10) be formed so as to intersect the solder-wicking direction (arrow D), an intermittent solder-wicking prevention area 11a may be formed.

Note that the solder-wicking direction (arrow D) is the direction in which the solder 120 advances, which is not limited to a vertically upward direction, but may be a horizontal direction.

Figure 4:
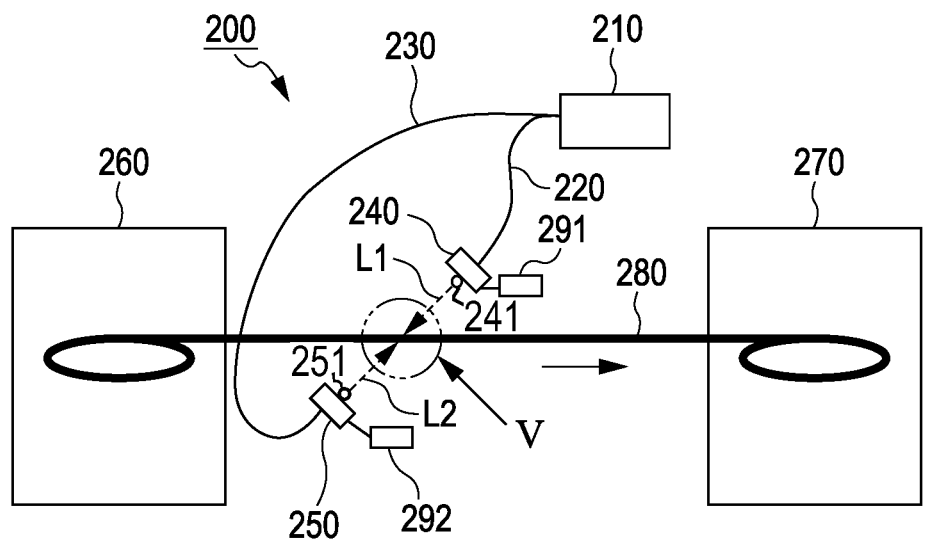
FIG. 4 is a schematic view of an apparatus for producing electronic-component lead terminals.

FIG. 4 is a schematic view of an apparatus 200 for producing electronic-component lead terminals.

Figure 5:
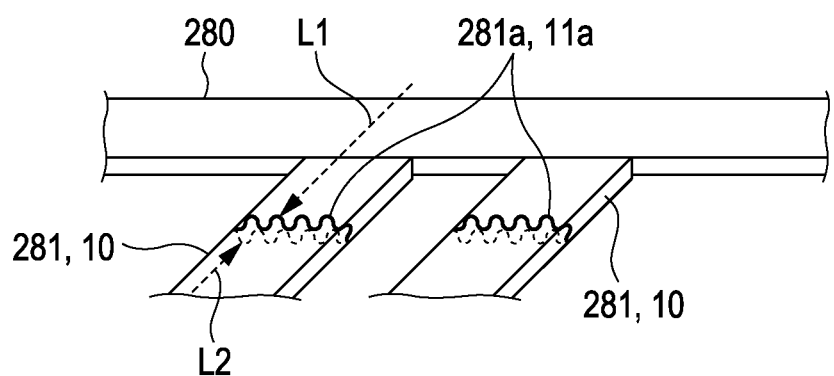
FIG. 5 is an enlarged view of a part V in FIG. 4.

FIG. 5 is an enlarged view of a part V in FIG. 4.

Figure 6A:
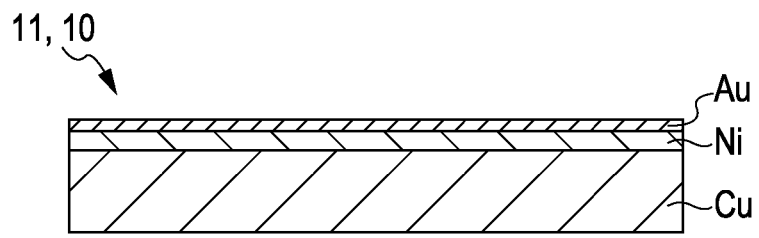
FIGS. 6A to 6C are cross-sectional views illustrating a method of providing a solder-wicking prevention area in an electronic-component lead terminal.
Figure 6B:
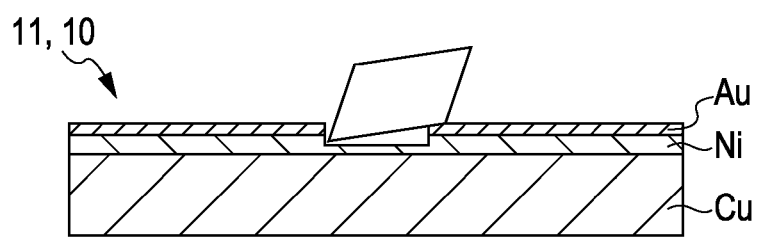
Figure 6C:
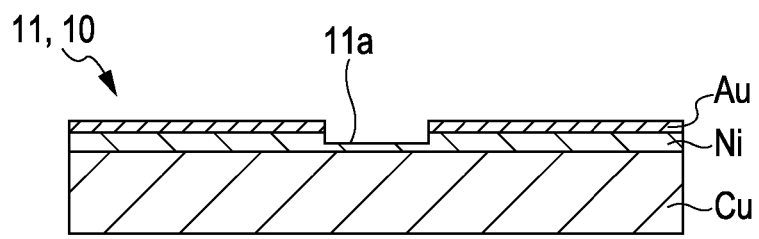

FIGS. 6A to 6C are cross-sectional views illustrating a method of forming the solder-wicking prevention area 11a in the electronic-component lead terminal 10.

For example, the apparatus 200 for producing electronic-component lead terminals illustrated in FIG. 4 includes a laser oscillator 210, optical fibers 220 and 230, laser irradiators 240 and 250 and laser beam windows 241 and 251, a lead feeding device 260 and a lead winding device 270, which are examples of moving members, a lead member 280, and irradiation-position moving units 291 and 292.

For example, the laser oscillator 210 generates a YAG laser beam having a wavelength of 1064 nm.

The optical fibers 220 and 230 guide the laser beam, which has been generated by the laser oscillator 210 and diverged into two beams, to the laser irradiators 240 and 250 and laser beam windows 241 and 251.

The laser irradiators 240 and 250 and laser beam windows 241 and 251 may include optical devices, such as a lens, a mirror, and the like, and the irradiation-position moving units 291 and 292 include, for example, a voice coil motor. The irradiation-position moving units 291 and 292 reciprocate the laser irradiators 240 and 250 and laser beam windows 241 and 251 in a direction perpendicular to the moving direction of the lead member 280 (a first direction) and parallel to the surface of the lead member 280 (a second direction). As illustrated in FIG. 5, the laser irradiators 240 and 250 and laser beam windows 241 and 251 form the solder-wicking prevention area 11a (281a) on plate-like protrusions 281 that will become the electronic-component lead terminals 10 of the lead member 280. The lead member 280 is set on the lead feeding device 260 and the lead winding device 270 so as to extend, like a belt, in the horizontal direction in FIG. 5 and is moved in the horizontal direction (the first direction) in FIG. 5 by the lead feeding device 260 and the lead winding device 270.

In the process of forming the solder-wicking prevention area 11a (281a), the laser beam window 241 irradiates two surfaces of the electronic-component lead terminal 10 (protrusion 281) with a laser beam L1, and the laser beam window 250 irradiates two surfaces of the electronic-component lead terminal 10 (protrusion 281) with a laser beam L2 (in total, four surfaces are irradiated). Thus, the surface of the electronic-component lead terminal 10 is removed, exposing the solder-wicking prevention area 11a (281a) having low solder wettability and having a plurality of peak portions projecting to the downstream side in the solder-wicking direction (arrow D). To achieve this, the laser beam windows 241 and 251 output the laser beams L1 and L2 at an angle to these surfaces.

The electronic-component lead terminals 10 (protrusions 281) are cut off from the lead member 280 and attached to the electronic component 1.

As illustrated in FIG. 6A, the vertical portion 11 (electronic-component lead terminal 10), on which the solder-wicking prevention area 11a is to be formed, includes a base material composed of copper (Cu), nickel (Ni) plating formed thereon, and gold (Au) plating formed thereon, for example.

When the laser irradiators 240 and 250 and laser beam windows 241 and 251 illustrated in FIG. 4 emit the laser beams L1 and L2, as illustrated in FIG. 6B, the Au plating on the surface is removed, exposing the Ni plating. Because Ni has lower solder wettability than Au, a region where the Ni plating is exposed serves as the solder-wicking prevention area 11a, as illustrated in FIG. 6C.

The lead feeding device 260 holds the lead member 280 wound on a reel.

The lead winding device 270 winds the lead member 280, whose protrusions 281 (electronic-component lead terminals 10) are provided with the solder-wicking prevention areas 281a (11a), on a reel. The protrusions 281 of the lead member 280 wound on the reel are cut off and bent. Thus, the electronic-component lead terminals 10 are obtained.

Figure 7:
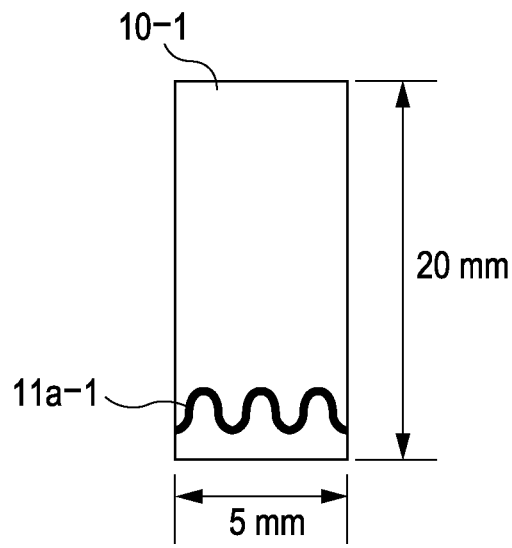
FIG. 7 is a front view of a sample for evaluating the solder-wicking preventing performance.

FIG. 7 is a front view of a sample 10-1 for evaluating the solder-wicking preventing performance.

Figure 8:
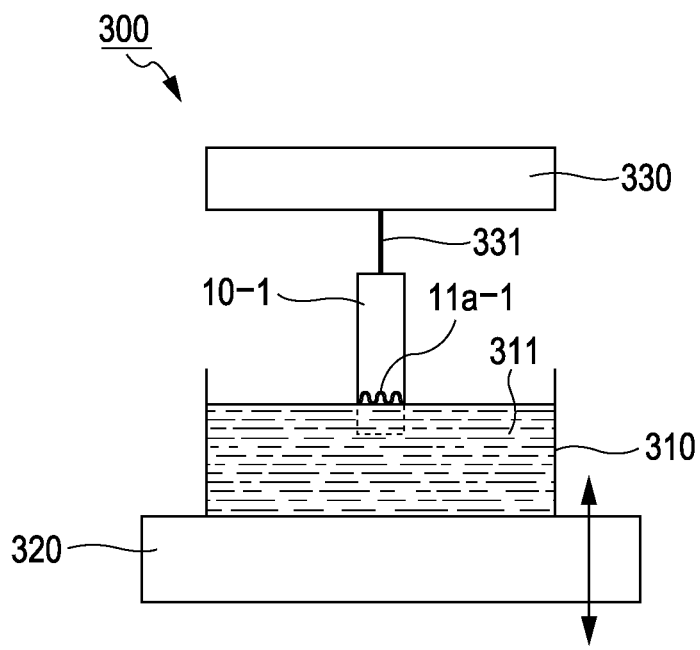
FIG. 8 is a schematic view of a test apparatus for evaluating the solder-wicking preventing performance.

FIG. 8 is a schematic view of a test apparatus 300 for evaluating the solder-wicking preventing performance.

FIG. 9 is a graph of solder-wicking preventing performance evaluation results.

The sample 10-1 of the electronic-component lead terminal 10, illustrated in FIG. 7, has a height of 20 mm and a width of 5 mm. The Cu base material has a thickness of 0.2 mm, Ni plating has a thickness of 2 μm, and Au plating has a thickness of 0.05 μm.

A solder-wicking prevention area 11a-1 is formed by using a YAG laser beam having a wavelength of 1064 nm, under conditions of an output of 0.05 W, a pulse width of 500 ps, and a repetition frequency of 500 Hz.

The solder-wicking prevention area 11a-1 in the shape of a sine wave having a width of 20 μm, an amplitude of 50 μm, and a wavelength of 200 μm is formed over the entire circumference of the sample 10-1. In FIGS. 7 and 8, the size of the solder-wicking prevention area 11a-1 relative to the size of the sample 10-1 is larger than reality.

The test apparatus 300 illustrated in FIG. 8 includes a solder reservoir 310 in which solder 311 is stored, an up-and-down stage 320 that vertically moves the solder reservoir 310, and a load meter 330 having a sample fixing portion 331, to which the sample 10-1 is fixed.

The solder reservoir 310 stores, for example, Sn60Pb40 (60% tin and 40% lead) solder 311 heated to a temperature of 240° C. by a heater (not illustrated).

The up-and-down stage 320 raises the solder reservoir 310 such that the sample 10-1 is dipped in the solder 311 in the solder reservoir 310 at a dipping speed of, for example, 1 mm/sec.

When the sample 10-1 is dipped in the solder 311, the solder 311 is blocked by the solder-wicking prevention area 11a-1. As the sample 10-1 is dipped deeper in the solder 311 after the solder 311 is blocked, the more buoyant force and surface tension are applied to the sample 10-1.

The load meter 330 measures the load applied to the sample 10-1 at the moment the solder 311 flows over the solder-wicking prevention area 11a. The solder-wicking preventing performance may be determined from the value of the load meter 330 measured in this manner.

As illustrated in FIG. 9, the load meter 330 outputs a value of 22 mV with the solder-wicking prevention area 11a-1 in the sample 10-1.

On the other hand, the load meter 330 outputs a value of 16 mV with a comparative sample 10-2, in which a straight-line-shaped wicking prevention area 11a-2 having a width of 60 μm is formed over the entire circumference. Note that the machining area of the electronic-component lead terminal 10 in a length of 1 mm in the width direction is 0.031 mm$^2$ with the sample 10-1, and that with the comparative sample 10-2 is 0.06 mm$^2$, that is, the amount of machining with the sample 10-1 is substantially half that of the comparative sample 10-2. Nevertheless, the load meter 330 outputs a higher value, indicating the solder-wicking preventing performance, with the solder-wicking prevention area 11a-1 in the sample 10-1 than the solder-wicking prevention area 11a-2 in the comparative sample 10-2.

Figure 10A:
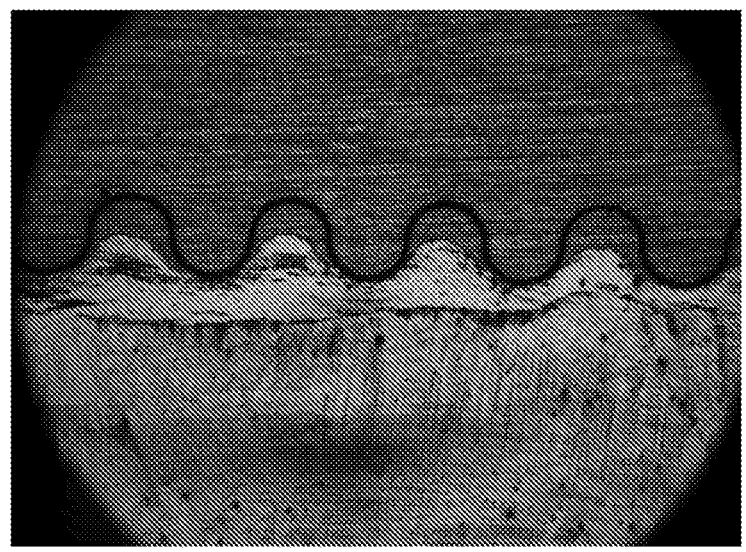
FIGS. 10A and 10B are enlarged views of a solder-wicking prevention area.
Figure 10B:
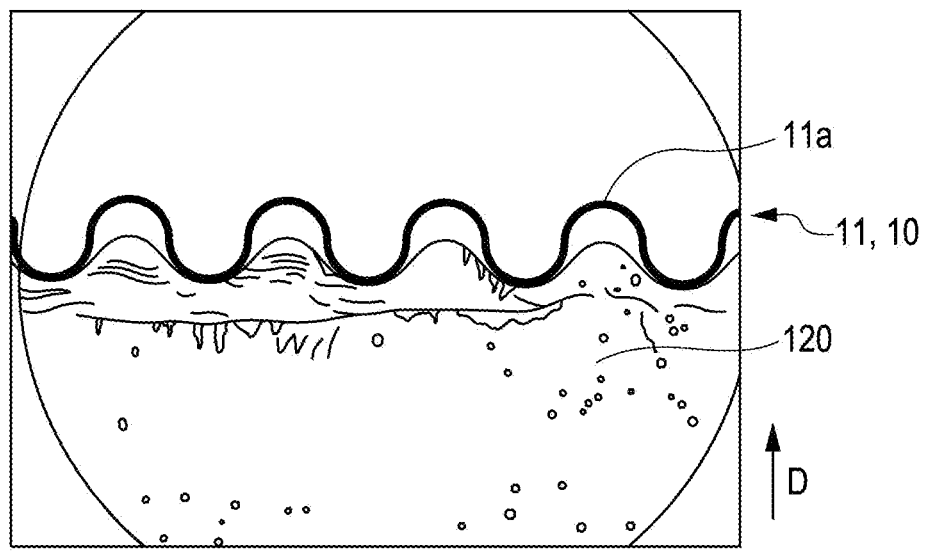

FIG. 10A is an enlarged photograph of the solder-wicking prevention area 11a, and FIG. 10B is a schematic view of FIG. 10A.

In the vertical portion 11 (electronic-component lead terminal 10) illustrated in FIGS. 10A and 10B, on which the solder-wicking prevention area 11a is formed, the Cu base material has a thickness of 0.2 mm, Ni plating has a thickness of 2 to 4 μm, and gold-palladium (Au—Pd) plating has a thickness of 1 μm.

The solder-wicking prevention area 11a has a sine-wave shape having a width of 20 μm, an amplitude of 100 μm, and a wavelength of 400 μm.

Furthermore, the solder-wicking prevention area 11a is formed by using a laser beam, under conditions of an output of 3 W (500 Hz), a machining speed in the top-bottom direction, which corresponds to the upstream side-downstream side direction in the solder-wicking direction (arrow D), of 10 mm/sec, and a machining speed in the width direction of the vertical portion 11, which intersects the solder-wicking direction (arrow D), of 10 mm/sec.

With the solder-wicking prevention area 11a formed under these conditions, because of portions projecting to the upstream side and the downstream side in the solder-wicking direction (arrow D), the width (the amount of machining) may be reduced and wicking of the solder 120 may be suppressed, compared with the straight-line-shaped solder-wicking prevention area 11a, as illustrated in FIGS. 10A and 10B. Note that the solder 120 illustrated in FIGS. 10A and 10B is Sn60Pb40 (60% tin and 40% lead) solder.

Figure 11A:
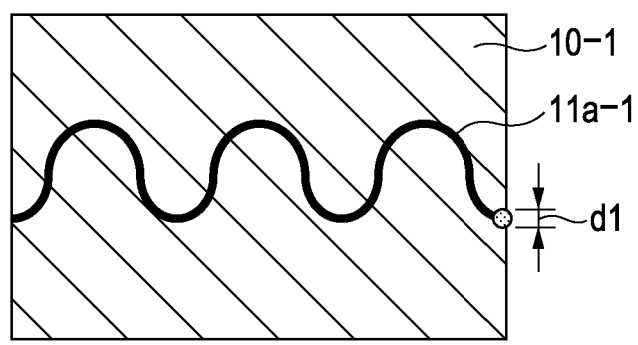
FIGS. 11A and 11B are schematic views illustrating a solder-wicking prevention area and the spot diameter of a laser beam.

By reducing the width of the solder-wicking prevention area 11a, the spot diameter d1 of the laser beam used to machine the solder-wicking prevention area 11a-1 in the sample 10-1 may be reduced, as illustrated in FIG. 11A.

Figure 11B:
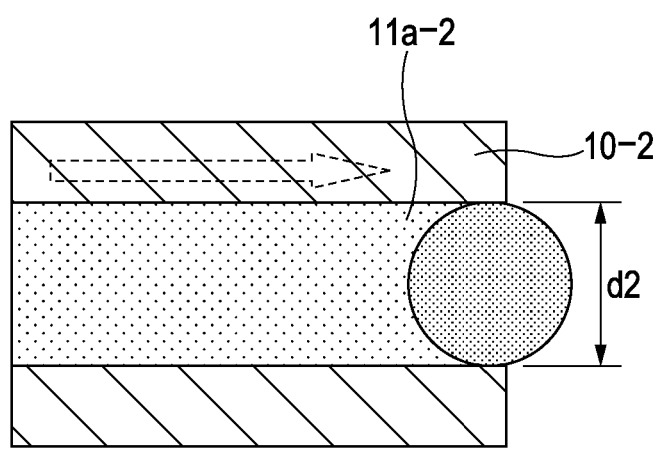

In contrast, as illustrated in FIG. 11B, the spot diameter d2 of the laser beam used to machine the straight-line-shaped solder-wicking prevention area 11a-2 in the comparative sample 10-2 is larger than the spot diameter d1 illustrated in FIG. 11A.

Therefore, the laser beam used to machine the solder-wicking prevention area 11a-1 in the sample 10-1 may be increased in energy density (output/spot area) than the laser beam used to machine the solder-wicking prevention area 11a-2 in the comparative sample 10-2. The output of the laser oscillator 210 illustrated in FIG. 4, the numerator, may be reduced by an amount corresponding to the decrease in spot area, the denominator. Because the price of the laser oscillator 210 largely depends on the output, the use of a low-output laser oscillator 210 contributes to significant cost reduction.

Figure 12:
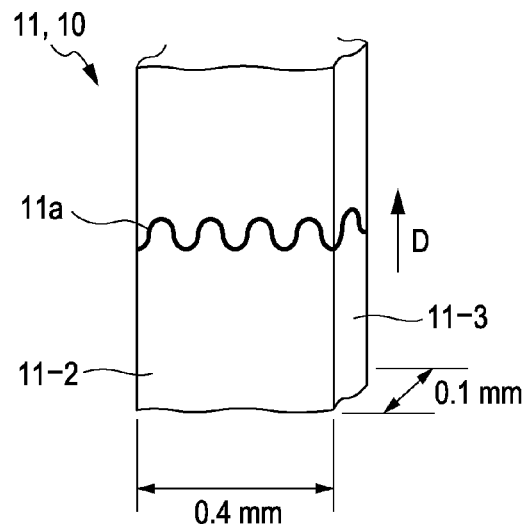
FIG. 12 is a perspective view of a vertical portion of an electronic-component lead terminal.

FIG. 12 is a perspective view of the vertical portion 11 of the electronic-component lead terminal 10.

Figure 13:
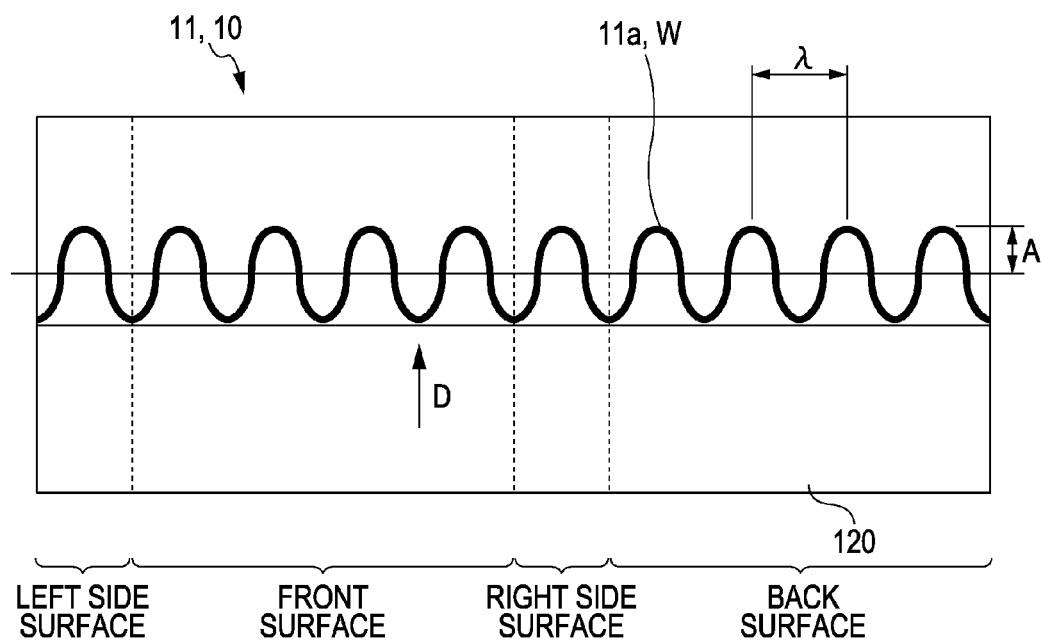
FIG. 13 is an expanded view of a vertical portion of an electronic-component lead terminal.

FIG. 13 is an expanded view of the vertical portion 11 of the electronic-component lead terminal 10.

As illustrated in FIG. 12, the vertical portion 11 of the electronic-component lead terminal 10 has, for example, a width of 0.4 mm and a thickness of 0.1 mm.

As illustrated in FIG. 13, the solder-wicking prevention area 11*a* in the vertical portion 11 is formed over the entire circumference of the vertical portion 11 (electronic-component lead terminal 10) so as to intersect the solder-wicking direction (arrow D). Furthermore, the wicking prevention area 11*a* has the shape of a wave (sine wave) whose tangent line in the middle of the amplitude A extends to the upstream side and the downstream side in the solder-wicking direction.

The wicking prevention area 11*a* projects to the downstream side in the solder-wicking direction (arrow D), on the front surface (surface), the back surface (rear surface), and the left and right side surfaces (in these surfaces, at both ends of the surfaces).

Note that the wicking prevention area 11*a* does not have to project to the downstream side in the solder-wicking direction (arrow D) on the front surface, the back surface, and the left and right side surfaces. For example, when the thickness is small, the wicking prevention area 11*a* may project on the front and back surfaces.

It is desirable that the solder-wicking prevention area 11*a* has the shape of a wave whose amplitude A and wavelength λ have the relationship λ/2≥A≥λ/8. This is because the amplitude A in the range of 2 to 1/2 times the amplitude A=λ/4, which is the amplitude when the solder-wicking prevention area 11*a* projects in a circular shape to the upstream side and the downstream side in the solder-wicking direction (arrow D), is desirable from the standpoint of the solder-wicking preventing performance.

Furthermore, it is desirable that the solder-wicking prevention area 11*a* have the shape of a wave whose amplitude A and width W have the relationship A W. This is because it is difficult to reliably suppress wicking of the solder 120 if the amplitude A is smaller than the width W.

Figure 14:
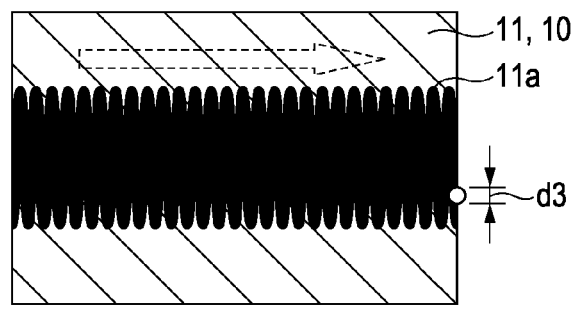
FIG. 14 is a schematic view illustrating a solder-wicking prevention area with a short wavelength.

Furthermore, it is desirable that the solder-wicking prevention area 11*a* have the shape of a wave whose wavelength λ and width W have the relationship λ>W, and it is more desirable that the solder-wicking prevention area 11*a* have the shape of a wave that has the relationship λ≥2×W. If these relationships are not met, many overlapping regions are formed in the solder-wicking prevention area 11*a*, as illustrated in FIG. 14, and it becomes difficult to reliably reduce the amount of machining.

Note that, because the relationships of the amplitude A, the wavelength λ, and the width W are only desirable examples, even when these relationships are not met, it is possible to reduce the amount of machining the solder-wicking prevention area 11*a* and suppress wicking of the solder 120.

Figure 15:
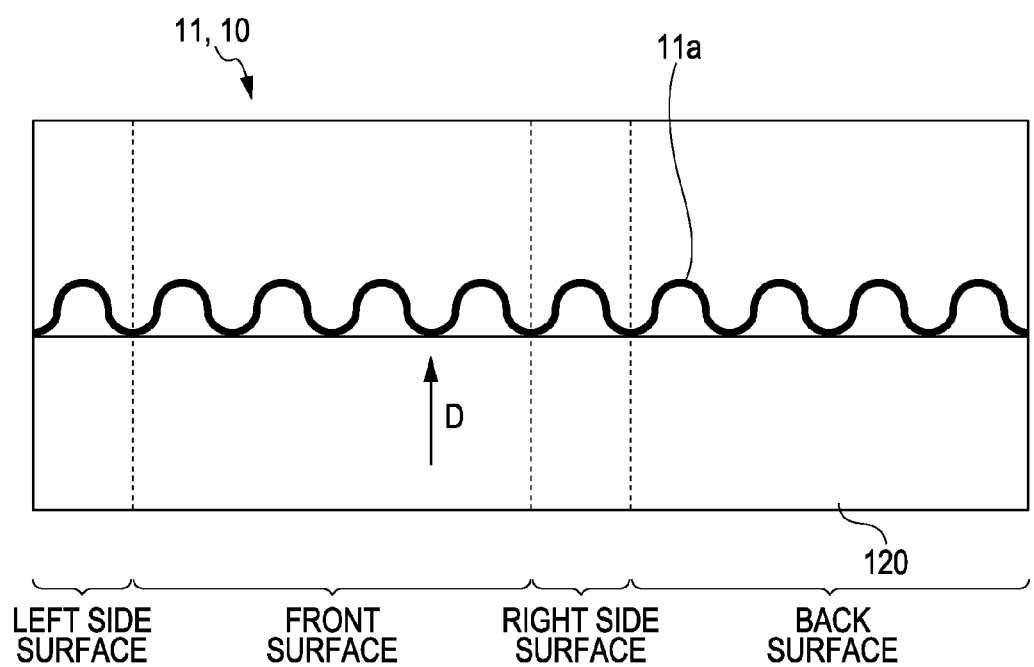
FIG. 15 is an expanded view of a vertical portion of an electronic-component lead terminal on which a sine-wave-like solder-wicking prevention area is formed.
Figure 16:
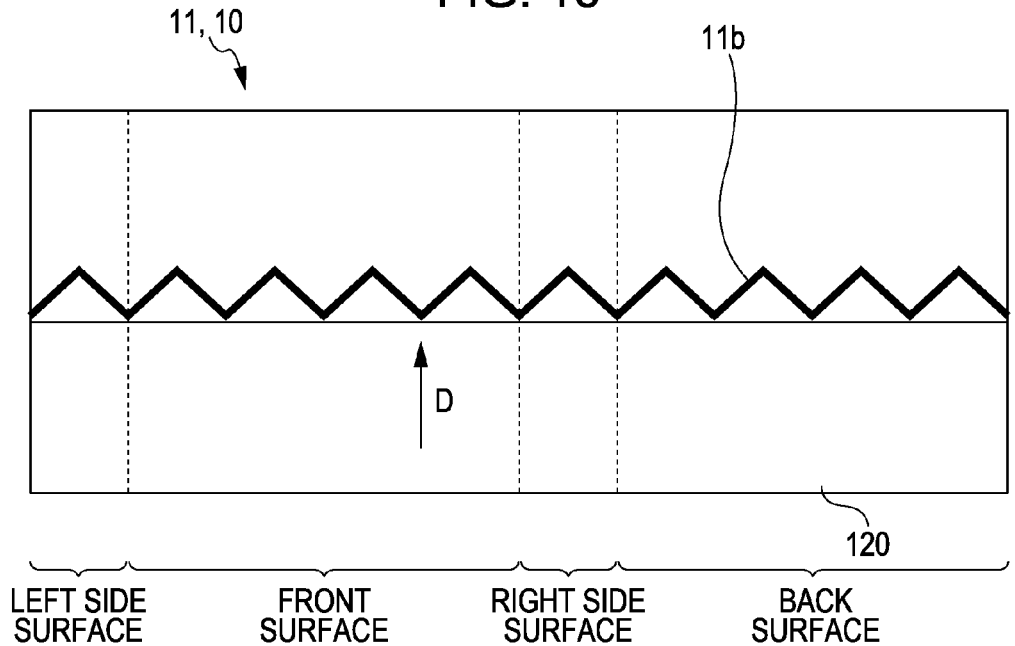
FIG. 16 is an expanded view of a vertical portion of an electronic-component lead terminal on which a triangular-wave-like solder-wicking prevention area is formed.

Furthermore, examples of the wave-like solder-wicking prevention area include the triangular-wave-like solder-wicking prevention area 11*b* as illustrated in FIG. 16, which do not have a sine-wave shape, in addition to the sine-wave-like (wave-like) solder-wicking prevention area 11*a* illustrated in FIG. 15.

Figure 17:
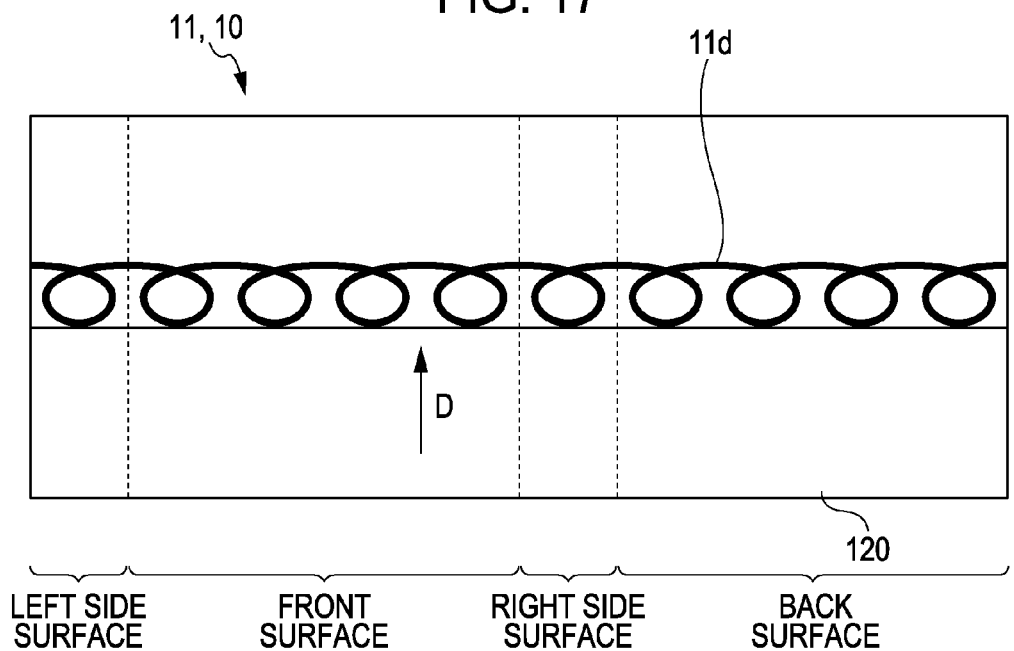
FIG. 17 is an expanded view of a vertical portion of an electronic-component lead terminal on which a repeating-loop-like solder-wicking prevention area is formed.
Figure 18:
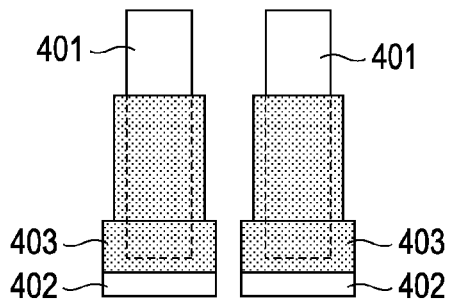
FIG. 18 is a schematic view illustrating bonding between lead terminals and electrode pads.
Figure 19A:
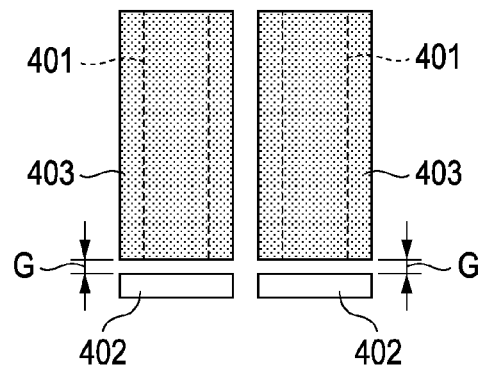
FIG. 19A is a schematic view illustrating a bonding state in which solder is separated.
Figure 19B:
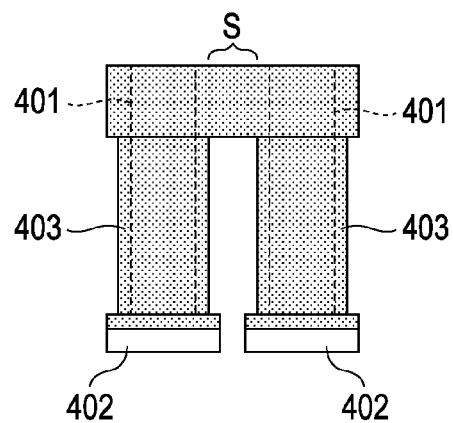
FIG. 19B is a schematic view illustrating a bonding state in which a short-circuiting occurs.
Figure 20A:
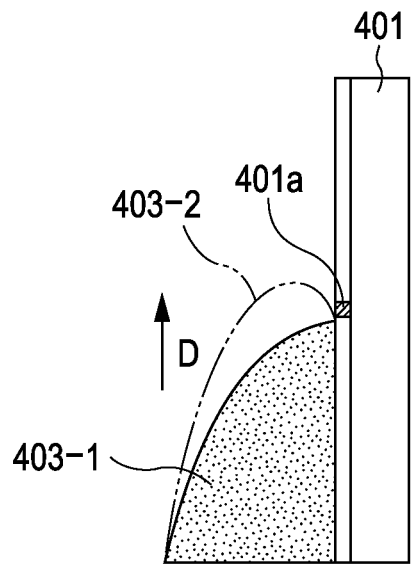
FIGS. 20A and 20B are side views illustrating a narrow solder-wicking prevention area.
Figure 20B:
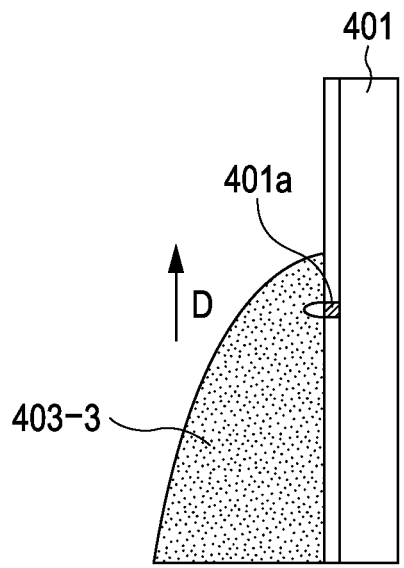
Figure 21A:
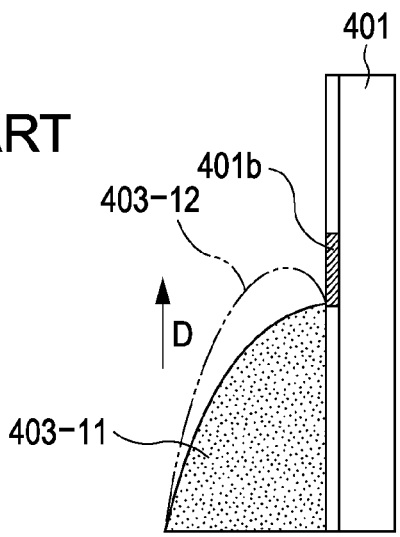
FIGS. 21A and 21B are side views illustrating a wide solder-wicking prevention area.
Figure 21B:
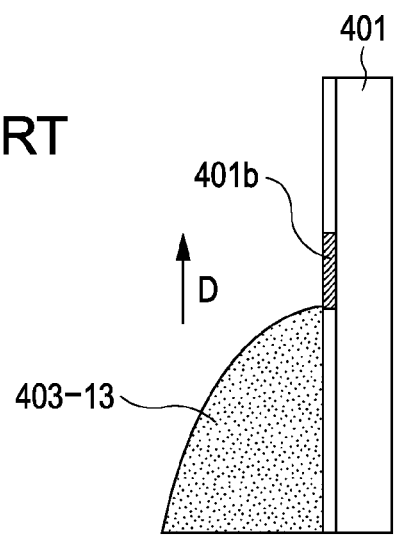
Figure 22:
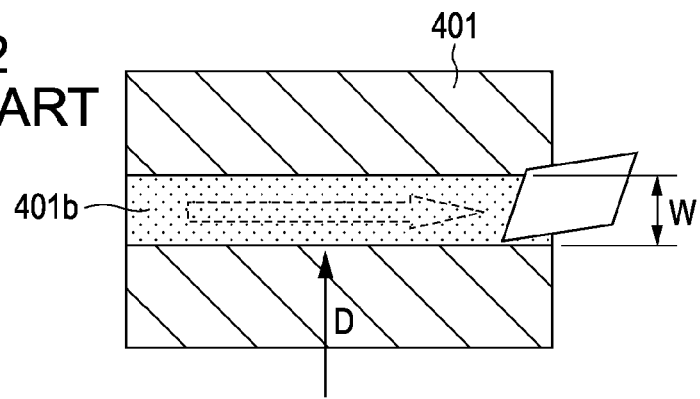
FIG. 22 is a front view illustrating the amount of machining when forming a wide solder-wicking prevention area.

Another example is a solder-wicking prevention area 11*d* having a repeating-loop-like portion projecting to the downstream side in the solder-wicking direction (arrow D), as illustrated in FIG. 17. When forming this solder-wicking prevention area 11*d*, the irradiation-position moving units 291 and 292 move the positions irradiated by the laser irradiators 240 and 250 and laser beam windows 241 and 251, illustrated in FIG. 4, not only to the upstream side and the downstream side in the solder-wicking direction (arrow D) and to one side (to the right) in the width direction of the vertical portion 11, but also to the other side (to the left) in the width direction of the vertical portion 11.

Note that it is possible to arrange a plurality of solder-wicking prevention areas projecting to the downstream side in the solder-wicking direction (arrow D) in parallel.

In the above-described embodiment, the solder-wicking prevention areas 11*a* to 11*d* each have a plurality of peak portions projecting to the downstream side in the solder-wicking direction (arrow D). Therefore, higher solder-wicking preventing performance may be achieved with a smaller amount of machining (width), compared with a straight-line-shaped solder-wicking prevention area. Therefore, with this embodiment, the solder-wicking preventing performance may be increased while reducing the amount of machining the solder-wicking prevention area 11*a* to 11*d* with laser.

Furthermore, in this embodiment, the solder-wicking prevention area has the shape of a wave, e.g., the sine-wave-like solder-wicking prevention area 11*a* illustrated in FIG. 15 and the triangular-wave-like solder-wicking prevention area 11*b* illustrated in FIG. 16. Therefore, wicking of the solder 120 may be suppressed by performing simple machining. Note that any wave shape may be employed as long as the wave includes a plurality of peak portions.

Furthermore, in this embodiment, the wave-like solder-wicking prevention areas 11*a* and 11*b* have the shape of a wave whose amplitude A and wavelength λ have the relationship λ/2≥A≥λ/8. Therefore, wicking of the solder 120 may be reliably suppressed.

Furthermore, in this embodiment, the wave-like solder-wicking prevention area 11*a* has the shape of a wave whose amplitude A and width W have the relationship A≥W. Therefore, wicking of the solder 120 may be reliably suppressed.

Furthermore, in this embodiment, the wave-like solder-wicking prevention area 11*a* has the shape of a wave whose wavelength λ and width W have the relationship λ>W, more desirably, the relationship λ≥2×W. Therefore, the amount of machining the solder-wicking prevention areas 11*a* and 11*b* may be reliably reduced.

Furthermore, in this embodiment, the solder-wicking prevention area 11*d* illustrated in FIG. 17 has repeating loop-like portions projecting to the downstream side in the solder-wicking direction (arrow D). Therefore, wicking of the solder 120 may be reliably suppressed.

Furthermore, in this embodiment, the electronic-component lead terminals 10 have a plate-like shape. Furthermore, the solder-wicking prevention areas 11*a* to 11*d* are formed on the electronic-component lead terminals 10 so as to intersect the solder-wicking direction (arrow D) in the circumferential direction. The solder-wicking prevention areas 11*a* to 11*d* project to the downstream side in the solder-wicking direction (arrow D) at least at the surfaces (front surfaces) and the rear surfaces (back surfaces) of the electronic-component lead terminals 10. Therefore, wicking of the solder 120 may be reliably suppressed at the surfaces (front surfaces) and the rear surfaces (back surfaces) of the electronic-component lead terminals 10.

Furthermore, in this embodiment, the solder-wicking prevention areas 11*a* to 11*d* project to the downstream side in the solder-wicking direction (arrow D) at the surfaces (front surfaces), rear surfaces (back surfaces), left side surfaces, and right side surfaces of the electronic-component lead terminals 10. Therefore, wicking of the solder 120 may be reliably suppressed at the surfaces (front surfaces), rear surfaces (back surfaces), left side surfaces, and right side surfaces of the electronic-component lead terminals 10.

Furthermore, in this embodiment, the solder-wicking prevention areas 11a to 11d are regions (Ni plating or the like) exposed from and having lower solder wettability than the surfaces (Au plating or the like) of the electronic-component lead terminals 10. Therefore, wicking of the solder 120 may be suppressed by performing simple machining.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic-component lead terminal comprising:
a lead terminal one end of which is connectable to an electronic component and the other end of which is connectable to an electrode; and
a solder-wicking prevention area formed on a surface of the lead terminal so as to intersect a solder-wicking direction oriented from the other end toward the one end, the solder-wicking prevention area having an oscillating wave shape including a plurality of portions projecting to a downstream side in the solder-wicking direction.

2. The electronic-component lead terminal according to claim 1, wherein the solder-wicking prevention area has an oscillating sine-wave shape.

3. The electronic-component lead terminal according to claim 1, wherein the solder-wicking prevention area has an oscillating triangular-wave shape.

4. The electronic-component lead terminal according to claim 1, wherein the amplitude A and the wavelength $\lambda$ of the wave shape has the relationship $\lambda/2 \geq A \geq \lambda/8$.

5. The electronic-component lead terminal according to claim 1, wherein the amplitude A and the width W of the wave shape has the relationship $A \geq W$.

6. The electronic-component lead terminal according to claim 1, wherein the wavelength $\lambda$ and the width W of the wave shape has the relationship $\lambda > W$.

7. The electronic-component lead terminal according to claim 1, wherein the wavelength $\lambda$ and the width W of the wave shape has the relationship $\lambda \geq 2 \times W$.

8. An electronic-component lead terminal comprising:
a lead terminal one end of which is connectable to an electronic component and the other end of which is connectable to an electrode; and
a solder-wicking prevention area formed on a surface of the lead terminal so as to intersect a solder-wicking direction oriented from the other end toward the one end, the solder-wicking prevention area having repeating loop-like portions projecting to the downstream side in the solder-wicking direction.

9. The electronic-component lead terminal according to claim 1, wherein the electronic-component lead terminal has a plate-like shape, and the solder-wicking prevention area is formed in a circumferential direction of the electronic-component lead terminal so as to project to the downstream side in the solder-wicking direction on a surface and a rear surface of the electronic-component lead terminal.

10. The electronic-component lead terminal according to claim 1, wherein the electronic-component lead terminal has a plate-like shape, and the solder-wicking prevention area is formed in a circumferential direction of the electronic-component lead terminal so as to project to the downstream side in the solder-wicking direction on a surface, a rear surface, a left side surface, and a right side surface of the electronic-component lead terminal.

11. The electronic-component lead terminal according to claim 1, wherein the solder-wicking prevention area is a region exposed from the surface of the electronic-component lead terminal and having low solder wettability than the surface.

12. An electronic component comprising:
an electronic component;
a lead terminal one end of which is connected to the electronic component and the other end of which is connectable to an electrode pad of a printed board; and
a solder-wicking prevention area formed on a surface of the lead terminal between the one end and the other end so as to intersect a solder-wicking direction oriented from the other end toward the one end, the solder-wicking prevention area having an oscillating wave shape including a plurality of portions projecting to the downstream side in the solder-wicking direction.

* * * * *